(12) United States Patent
Keay et al.

(10) Patent No.: US 6,314,047 B1
(45) Date of Patent: Nov. 6, 2001

(54) LOW COST ALTERNATIVE TO LARGE DUAL PORT RAM

(75) Inventors: John Keay; Iain Robertson, both of Bedforshire (GB); Karl M. Guttag, Dallas, TX (US); Keith Balmer, Bedford (GB)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/713,560

(22) Filed: Nov. 15, 2000

Related U.S. Application Data

(60) Provisional application No. 60/173,762, filed on Dec. 30, 1999.

(51) Int. Cl.$^7$ .................................................. G11C 8/00
(52) U.S. Cl. ........................ 365/230.05; 365/189.01; 365/189.02; 365/221; 365/230.02
(58) Field of Search ..................... 365/230.05, 189.01, 365/189.02, 221, 230.02, 189.04, 230.08, 189.05

(56) References Cited

U.S. PATENT DOCUMENTS 5,999,478 * 12/1999 Proebsting ...................... 365/230.05

FOREIGN PATENT DOCUMENTS

403157890A * 7/1991 (JP) ................................ G11C/7/00

* cited by examiner

Primary Examiner—David Nelms
Assistant Examiner—David Lam
(74) Attorney, Agent, or Firm—Robert D. Marshall, Jr.; W. James Brady, III; Frederick J. Telecky, Jr.

(57) ABSTRACT

Data transfer between multiple processor nodes and multiple static memory storage nodes is made more efficient using a wrapper of logic surrounding a conventional single port static memory function. The wrapper logic comprises FIFO devices which provide buffering between a given processor node and its associated memory function. The added buffering allows the design to trade allowable added read and write latency for a significant reduction in memory complexity. A single port random access memory structure enclosed within the wrapper provides the functional throughput advantage that only a dual port memory device would otherwise make possible.

14 Claims, 9 Drawing Sheets

LOW COST ALTERNATIVE TO LARGE DUAL PORT RAM

This application claims priority under 35 USC §119(e)(1) of Provisional Application No. 60/173,762, filed Dec. 30, 1999.

TECHNICAL FIELD OF THE INVENTION

The technical field of this invention is digital data storage and particularly dual port memories.

BACKGROUND OF THE INVENTION

The present invention deals with the data storage in digital signal processor chips having multiple processor-memory nodes. Conventional techniques would use a dual-port SRAM for a read and a write to be accomplished on a single clock cycle. Using a single port SRAM is normally much too restrictive and limits throughput by allowing only a read or a write in a given clock cycle. The bit cell size for a dual-port SRAM, however, is considerably larger typically four times as large as a cell for a single port SRAM. When a large SRAM is required, this is a significant silicon overhead.

One conventional technique which has been used to circumvent this limitation is to use a single port SRAM running at twice the frequency of the surrounding logic. This allows a simple time division multiplexing system to be used around the SRAM so that to the surrounding logic the SRAM appears dual ported. Each of the two-processor entities needing access to the SRAM appears to get it each cycle. In fact, one processor gets access in the first half of the cycle of the main clock and the second processor in the latter half. This works well at moderate clock speeds. However, if processor clock speed is itself aggressively high getting the SRAM to run at twice that speed is often not possible.

SUMMARY OF THE INVENTION

This invention makes possible -the implementation of certain dual port memory node functions using a considerably simplified and efficient approach employing single port SRAM and a wrapper interface. These parts together use less silicon area than conventional dual port SRAM techniques. This allows for more straightforward read-write operations during a single clock cycle, which make up the data storage and data retrieval process. The inventive technique, operating at the main processor clock frequency, achieves performance comparable to dual port SRAM operating at double the main processor clock frequency.

The invention is particularly applicable in system designs with a SRAM organized in multiple banks, all of which might be accessed at once. In the preferred embodiment the main central processing unit accesses two of the banks every cycle, and a centralized data transfer controller needs access to one bank. If both entities require access to different banks, the operation proceeds smoothly, but if both entities required access to the same bank there would be a conflict. The clear preference is to avoid having to stall either processor entity.

The present invention employs a wrapper around the multiple banks of SRAM which is accessed by both a central processing unit and a data transfer bus node of a data transfer controller simultaneously. This wrapper buffers data and serializes it for access to the SRAM banks. There is at least one bank of SRAM that is not being accessed directly on each cycle, and this cycle can be used for any buffered access encountered in earlier cycles.

While the system does not completely eliminate the need to stall the central processing unit due to a bank access conflict and the buffer holding queued accesses that conflicted in previous cycles may fill up, the system does significantly reduce the need for stalls.

The preferred embodiment employs four banks of SRAM but it can be generalized to down to a two-bank system where each of the devices needs access to one bank in each cycle. The probability that the two devices both want access to the same bank on many consecutive cycles is very low. This is especially true with a data transfer controller which tends to transfer data sequentially and tends to alternate between the banks.

For small SRAMs, the device area required to implement this technique would probably be more than that of just using a dual port SRAM. However, for large SRAMs this invention will prove cost effective.

BRIEF DESCRIPTION OF THE DRAWINGS

These and other aspects of this invention are illustrated in the drawings, in which.

DETAILED DESCRIPTION OF PREFERRED EMBODIMENTS

Figure 1A:
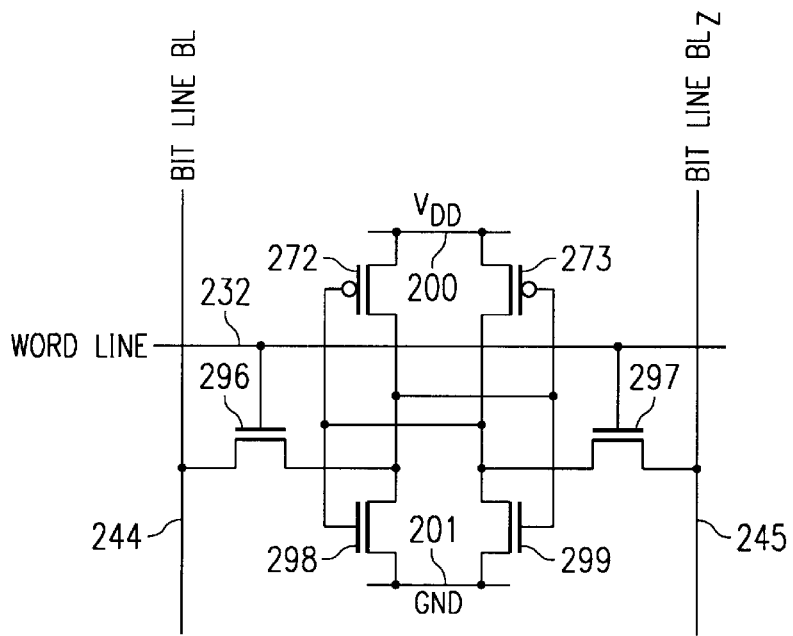
FIGS. 1A–1B illustrates a conventional dual port SRAM cell structure contrasted with conventional single port SRAM cell structure.
Figure 1B:
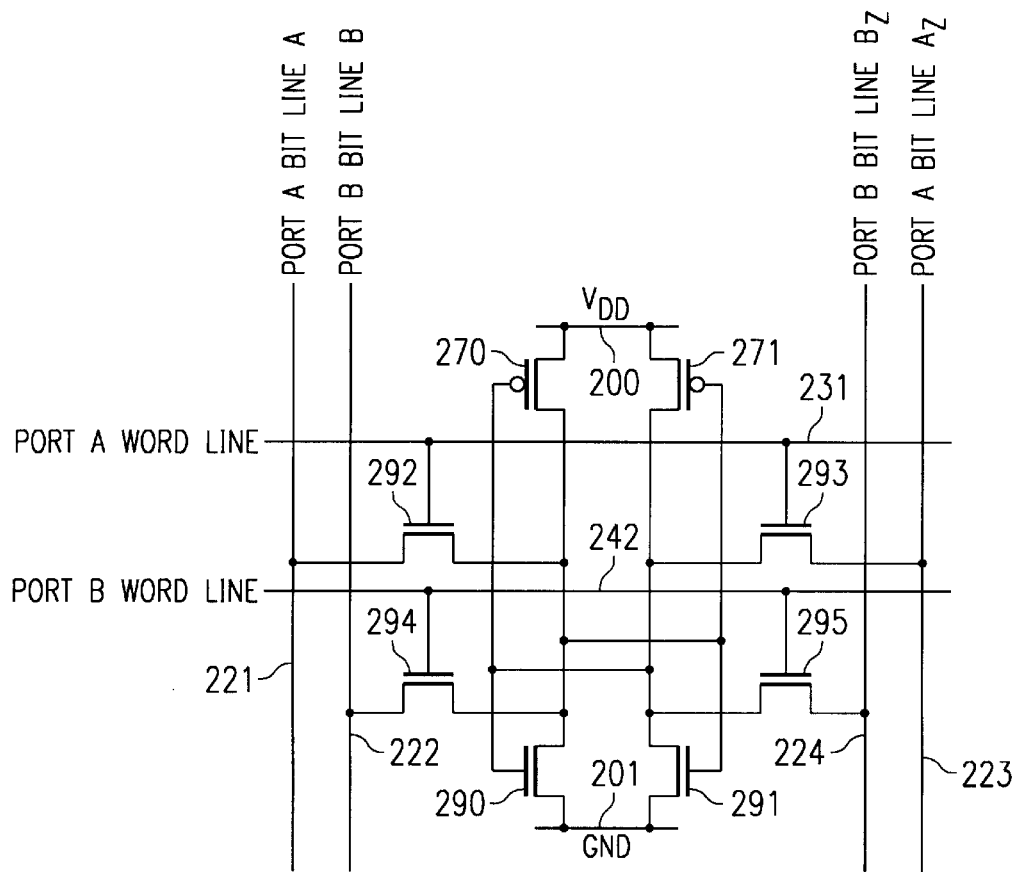

FIG. 1 illustrates the contrast between two static random access memory (SRAM) cells. FIG. 1A illustrates a single port SRAM cell and FIG. 1B illustrates a dual port SRAM cell. In the single port cell of FIG. 1A, a latch formed by P-channel transistors 272 and 273 and N-channel transistors 298 and 299 is disposed between power supply 200 and ground 201. When word line 232 is enabled, N-channel transistors 296 and 297 couple the latch to bit lines 244 and 245. Bit lines 244 and 245 provide dual rail drive for writing data and also provide dual rail sensing of stored data for read operations.

In the dual port version of FIG. 1B, a similar latch formed by P-channel transistors 270 and 271 and N-channel transistors 290 and 291 is disposed between power supply 200 and ground 201. Separate bit lines and word lines are required for each port. When port A word line 231 is enabled, N-channel transistors 292 and 293 couple the latch to port A bit lines 221 and 223. Port A bit lines 221 and 223 provide dual rail drive for writing data and also provide dual rail sensing of stored data for read operations. When port B word line 242 is enabled, N-channel transistors 294 and 295 couple the latch to port B bit lines 222 and 224. Port B bit lines 222 and 224 provide dual rail drive for writing data and also provide dual rail sensing of stored data for read operations. While the total number of transistors is six for the single port version and eight for the dual port version, the number of lines which are routed through the cells are three for the single port and six for the dual port. The number of requires lines and the transistor sizes are much more significant than component count in a multi-level interconnect sub-micron process. In actual designs, this combination of factors makes the dual port cell about four times larger than the single port cell.

Figure 2:
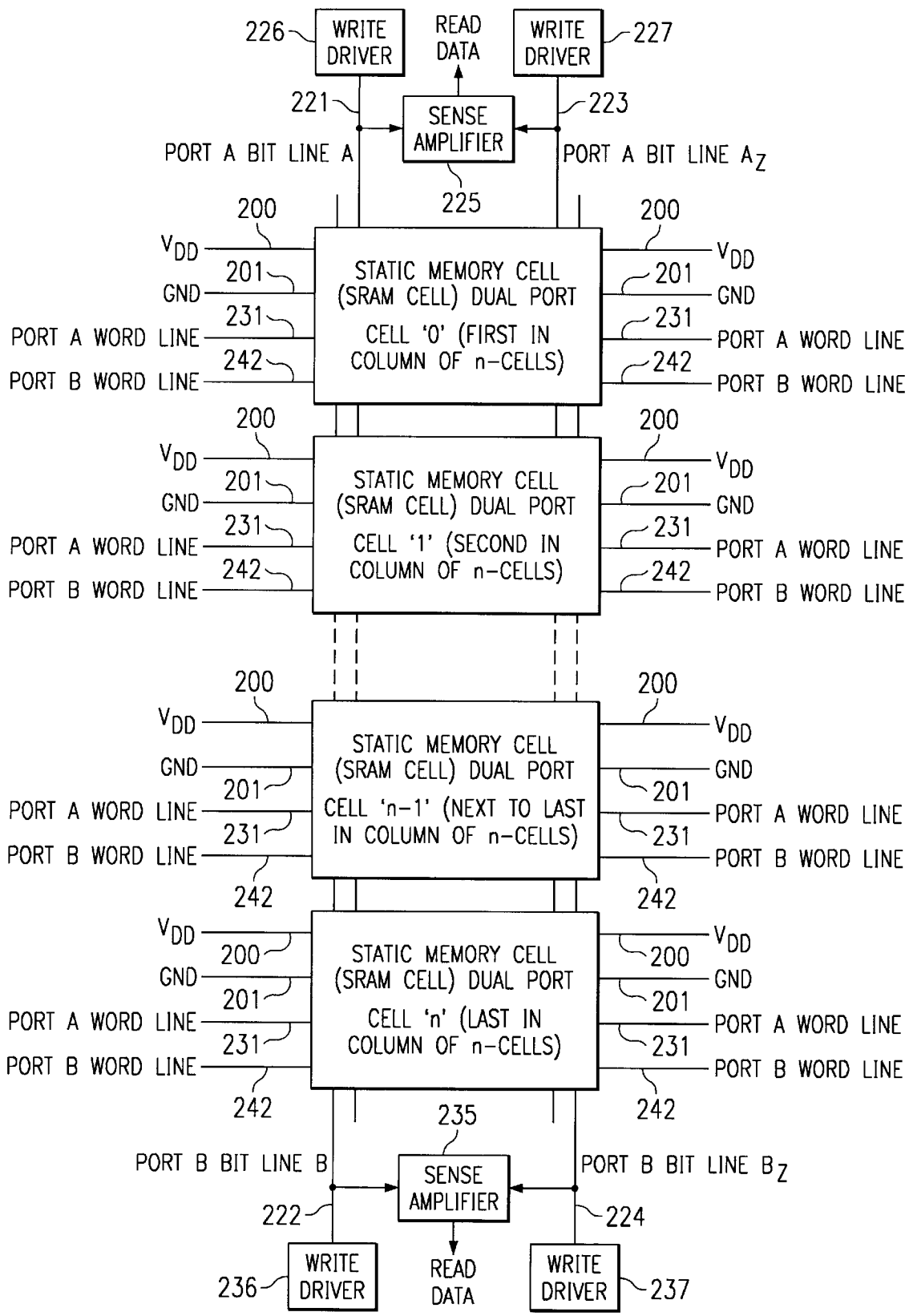
FIG. 2 illustrates a conventional dual port SRAM cells in an n-cell column.

FIG. 2 illustrates conventional dual port SRAM cells arranged in an n-cell column. At the top of FIG. 2, connections to port A are labeled bit lines A 221 and $A_z$ 223. These dual rail lines which connect the write drivers 226 and 227 for port A data to this column, can direct the data to be stored in this bit of any word by activating the word line go address for this bit. In a read operation, these same dual rail lines serve as connections to the port A sense amplifier 225. Sense amplifier 225 has differential inputs and accepts the stored data from this bit of the addressed word. Sense amplifier 225 normally includes a latching function to provide stable retrieval of the data. Similar connections apply to port B at the bottom of FIG. 2 where connections to port B are called bit lines B 222 and $B_z$ 224 and these same dual rail lines serve as connections to the port B sense amplifier 235 and corresponding write drivers 236 and 237.

Figure 3:
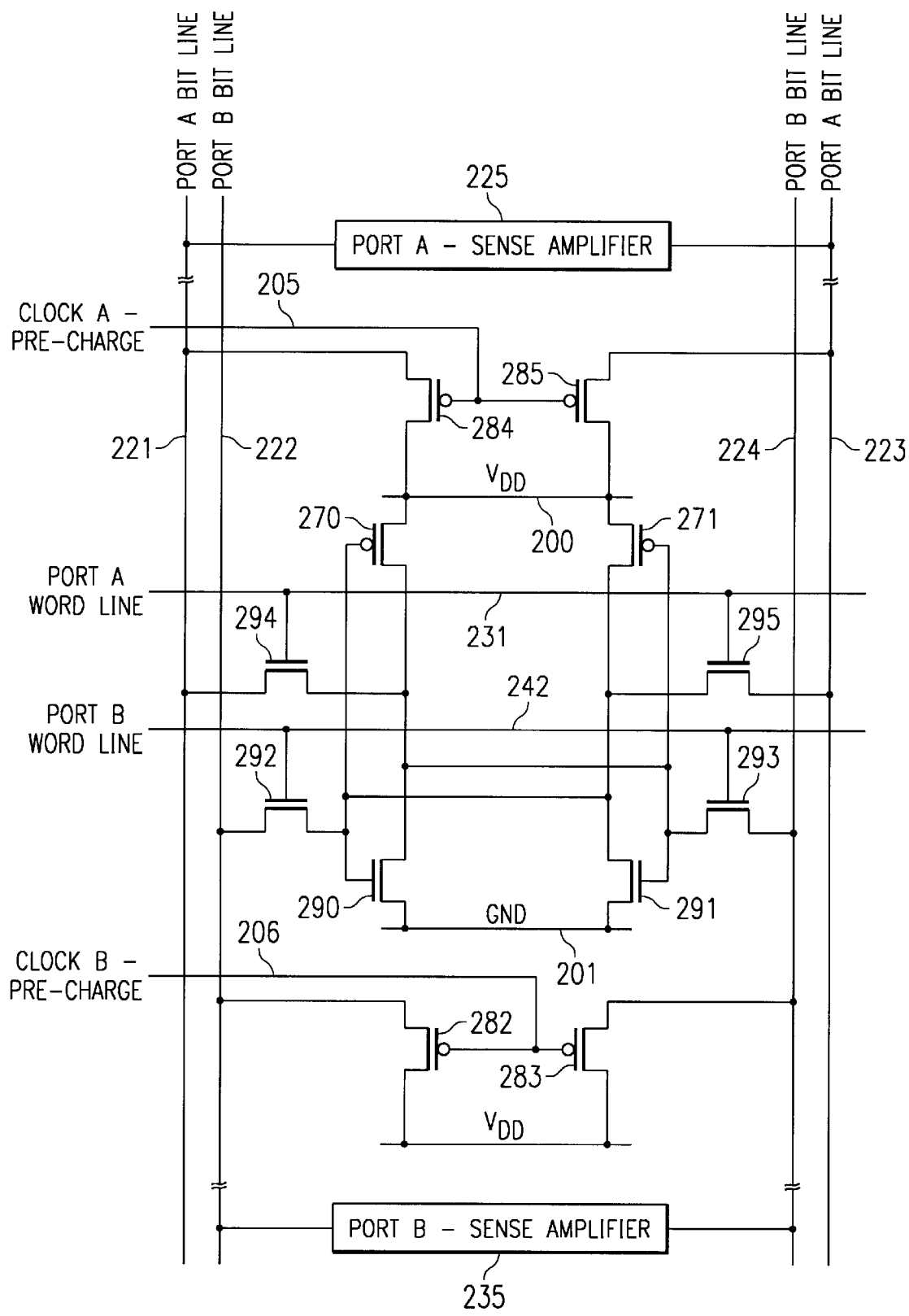
FIG. 3 illustrates an individual dual port SRAM cell showing word line and bit line connections and pre-charge circuitry.

FIG. 3 illustrates details of a dual port SRAM cell with word lines, bit lines and precharge circuitry. Because of the complexity of the cell extreme care must be taken in arrangement of the layout of components and interconnect. Power bussing, clock routing, capacitive coupling between signal leads, positive voltage supply ($V_{DD}$) and ground distribution are all major concerns in the design process. When enabled precharge clock A 205 causes P-channel precharge transistors 284 and 285 to conduct connecting respective port A bit lines 221 and 223 to the supply voltage 200. Precharge clock A 205 is then disabled cutting off P-channel precharge transistors 284 and 285. Next port A word line 231 corresponding to the selected row is enabled causing N-channel transistors 294 and 295 to conduct. The state of the latch pulls one of port A bit lines 221 and 223 to ground. The change of state of one of the port A bit lines 221 and 223 is detected by port A differential sense amplifier 225, which is enabled for reading only after port A word line 231 is enabled. Precharge clock A 206 similarly enables P-channel precharge transistors 282 and 283 to precharge port B bit lines 222 and 223. When precharge clock A is disabled and the corresponding row port B word line 242 is enabled, the state of the latch pulls one of port B bit lines 222 and 223 to ground via one of N-channel transistors 292 or 293. This change of state is sensed by port B differential sense amplifier 235.

Figure 4:
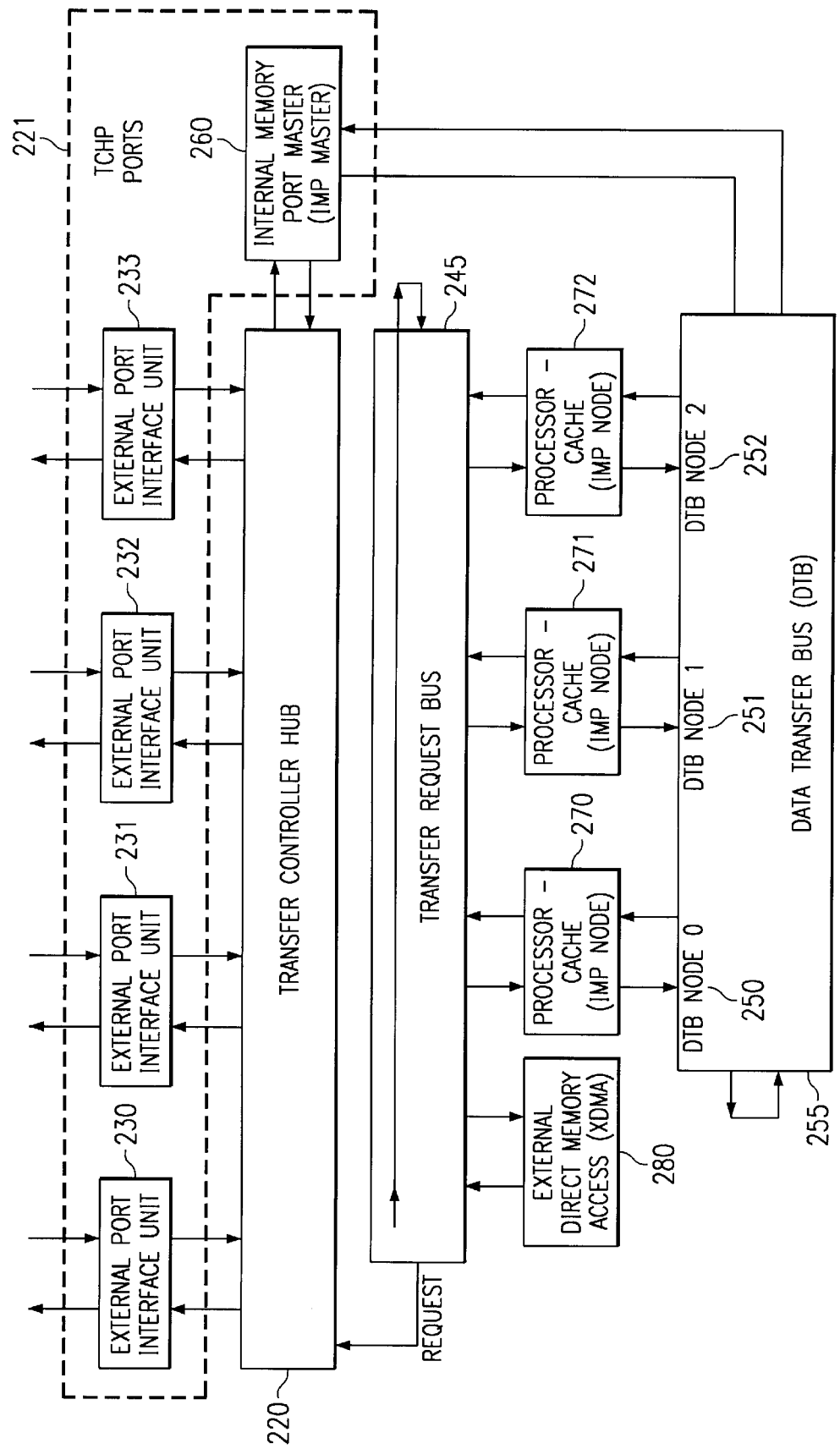
FIG. 4 illustrates a conventional multi-processor system utilizing multiple dual port SRAM banks.

FIG. 4 illustrates an overview of an multiprocessor integrated circuit employing the transfer controller with hub and ports of a type to which this invention is useful. The transfer controller with hub and ports 220 and the ports including external port interface units 230 to 233 and internal memory port master 260 are the first two main functional blocks. Though four external port interface units 230, 231, 232 and 233 are illustrated, this is an example only and more or less could be employed. Other main functional blocks include the transfer request bus 245 and the data transfer bus (DTB) 255. These are closely associated functional units that are but not a part of the transfer controller with hub and ports 220. Transfer request bus 245 is coupled to plural internal memory port nodes 270, 271 and 272. Though three internal port nodes 270, 271 and 272 are illustrated, this is an example only and more or less could be employed. Each of these internal memory port nodes preferably includes an independently programmable data processor, which may be a digital signal processor, and corresponding cache memory or other local memory. Each of the internal memory port nodes 270, 271 and 272 can submit transfer requests via transfer request feed mechanism 245 and has memory that can be a source or destination for data. Transfer request bus 245 prioritizes these packet transfer requests in a manner not relevant to this invention. Transfer request bus 245 is further responsive to externally generated transfer requests received via external direct memory access (XDMA) unit 280. Transfers originating from or destined for internal memory port nodes 270, 271 or 272 are coupled to transfer controller with hub and ports 220 via internal memory port master 260, data transfer bus 255 and the corresponding data transfer bus nodes 250, 251 and 252. FIG. 4 highlights the connection of data transfer bus 255 to multiple internal memory port nodes 270, 271 and 272 via corresponding data transfer bus nodes 250, 251 and 252, and the possible connection of multiple transfer request nodes to transfer request bus 245.

Figure 5:
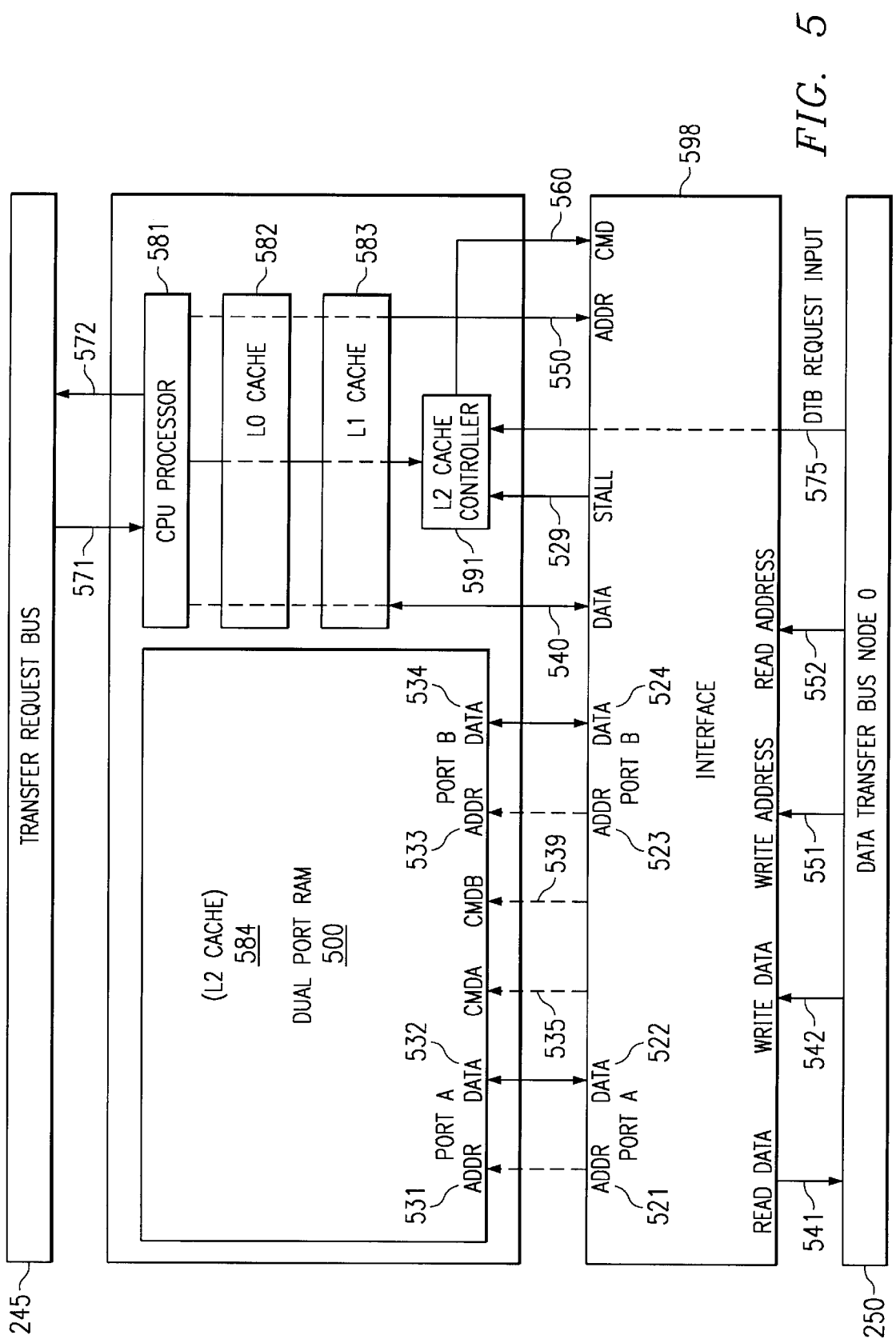
FIG. 5 illustrates a functional block diagram of internal processor-cache internal memory port node using dual port SRAM.

FIG. 5 illustrates the block diagram of a processor 581 and a companion cache node composed of level-0 cache node 582, level-1 cache node 583 and data transfer bus node 250 interfaced with a common dual port SRAM level-2 cache node 584. L2 cache controller 591 satisfies all cache protocol requirements. Using the dual port SRAM requires two data buses 532 and 534 while a single port SRAM requires only a single data bus. When a dual port SRAM is used several other requirements are involved. First, timing becomes more critical because extra margins must be provided for in the SRAM control signals so that interaction between the read with the write circuitry is avoided. Secondly, memory cells of significant additional complexity must be used as previously noted in FIG. 1. In some designs the added silicon area consumed by the additional complexity is so severe that a modified approach is used.

A common technique is to employ a clock of twice the frequency of processor 581 to generate SRAM timing. This allows a simple time division multiplexing system to be used around the SRAM so that to the surrounding logic the SRAM appears dual ported. Each of the two entities, DTB node 250 and processor 581, requiring access to the dual port SRAM 500, which is in this example is level 2 cache memory function 584, appears to get it each cycle. In fact, one gets it in the first half of the cycle and the second gets it in the latter half. This works well at moderate clock speeds. However, if the processor speed is already aggressive, designing the SRAM to operate at twice the processor speed is not possible. The interface block 598 of FIG. 5 is relatively simple in principle but the high clock frequency requirement and associated design and fabrication considerations are severe. Thus clocking the SRAM at twice the frequency of processor 581 is frequently impossible. Any comparable performance memory using single port SRAM with a more complex interface block is an attractive alternative provided the interface complexity increase is not prohibitive. This approach is the subject of the present invention.

Figure 6:
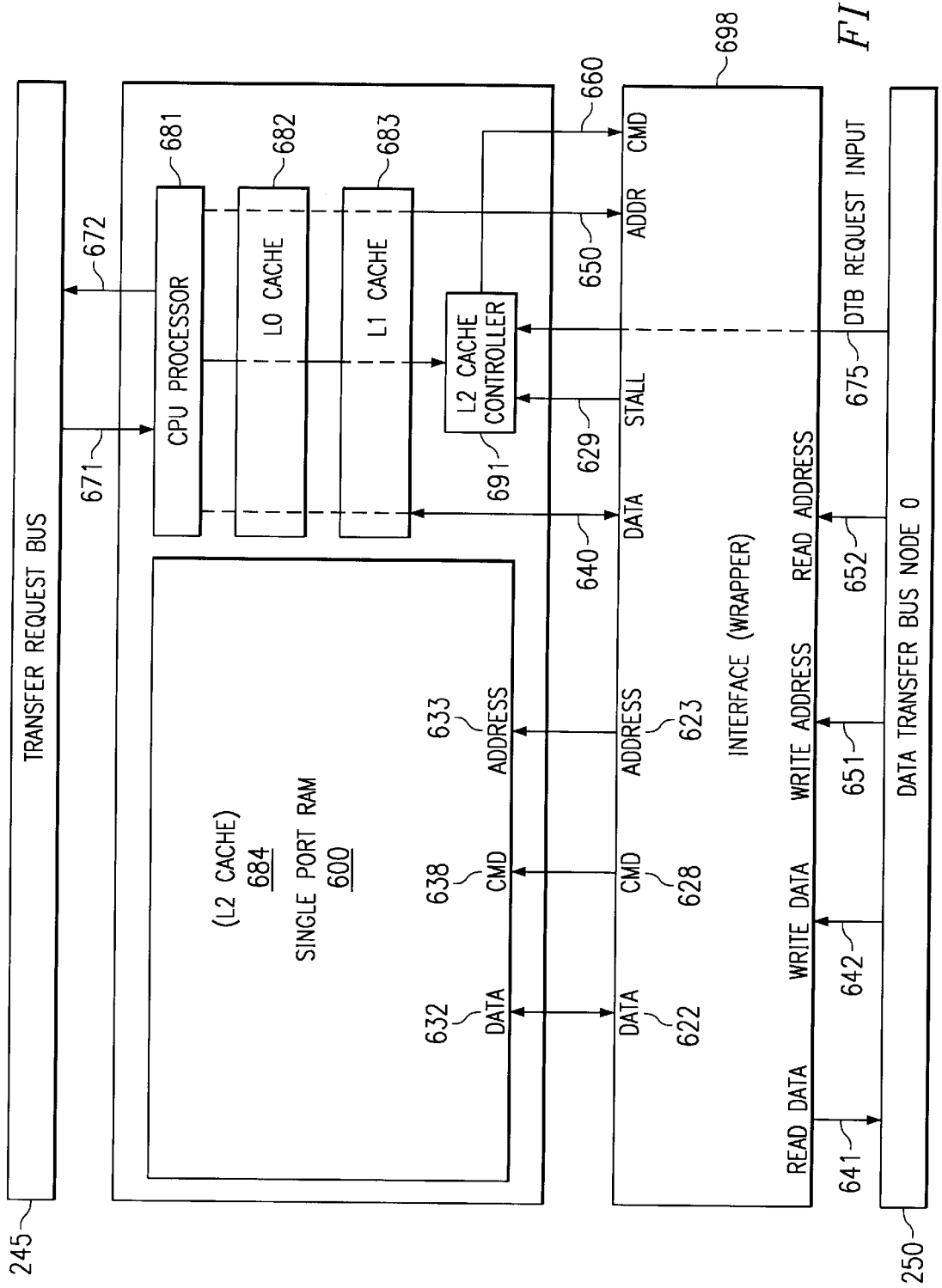
FIG. 6 illustrates a functional block diagram of internal processor-cache internal memory port node using a single port SRAM and the wrapper unit of this invention.

FIG. 6 illustrates the block diagram of a processor unit interfaced with a single port SRAM 600 and a more complex interface 698 than interface 598 illustrated in FIG. 5. The dual port memory system illustrate in FIG. 5 allows a read and a write in a single clock cycle. The single port memory system illustrated in FIG. 6 allows only a write or a read in a given clock cycle. The only outstanding difference between these two high level functional block diagrams is the two data buses 532 and 534 in the dual port version of FIG. 5, which replaces the single data bus 632 of the single port version of FIG. 6. The dashed line address busses 531 and 533 of the dual port version illustrated in FIG. 5 are actually merged into a single address bus time multiplexed by virtue of operation at double clock frequency. The two command lines 535 and 539, which determine whether a port reads or writes, are likewise merged into a single time multiplexed command line. The single port version of FIG. 6 could be operated at twice the clock frequency to achieve pseudo dual port performance, but as discussed above, this is often not feasible in systems having extremely high frequency processor clock requirements.

This invention describes a technique which places a wrapper function around the single port SRAM 600 of FIG. 6. Interface 698 includes additional buffering which allows margin in the read/write latencies to be traded for reduced cell complexity. The application of this technique to processor chip designs is predicated upon certain provisos. The multiple processors need access to the memory structure. The memory can be partitioned into banks, such that one or more of the bits, typically the least significant bits, of the address determine which bank will be accessed. The probability of one of the processors wanting to access the same bank repeatedly on consecutive cycles is low.

As already pointed out, there are two conventional ways of meeting this design requirement. The first conventional way is using a dual port SRAM. This has the advantage that both processor entities would have unfettered access to the stored data but the disadvantage that it would be expensive for large SRAMs as dual port SRAMs are typically twice the size of the single port. The second conventional way is to use a single port SRAM and sustain the performance shortcomings. This has the advantage of low silicon area cost but has the disadvantage that when both entities need access to the SRAM, one of them would need to be stalled, reducing performance.

The present invention enhances the single port approach reducing or eliminating the need to stall one of the entities depending on the SRAM access patterns of the system. The single port SRAM has a predetermined read and write latency. The read latency is the number of cycles between when a read command is provided and when the read data is returned. This is called $L_r$. The write latency is the number of cycles between when a write command is provided and when the data is actually written to the SRAM. This is called $L_w$. In general, $L_w$ is usually small or zero and is not of great concern. This is because the write latency is not visible to the accessing entity. $L_r$ is typically 0 or 1 clock cycles but larger delays can usually be accommodated without difficulty.

Figure 7:
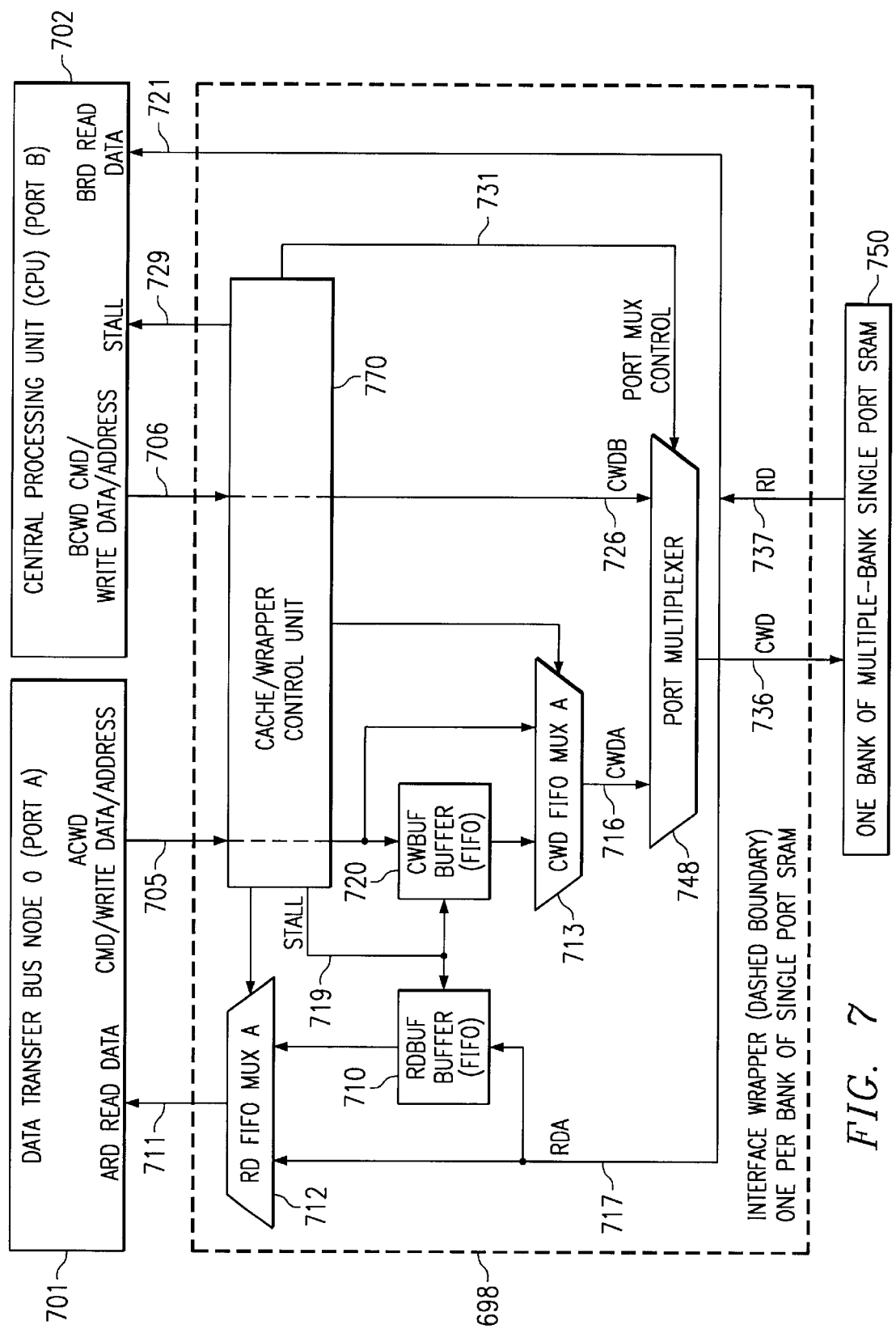
FIG. 7 illustrates an asymmetrical low cost SRAM structure with dual port SRAM functionality.

FIG. 7 illustrates the architecture for one bank of a two bank SRAM structure of the preferred embodiment of this invention. Note that some address bits, generally the least significant address bits, determine which memory bank is accessed by the two requestors. The two ports are data transfer bus node 0 port A 701 and central processing unit port B 702. One wrapper unit 698 as illustrated within the dashed lines of FIG. 7 is required for each bank of single port SRAM used. The signals ACWD 705 and BCWD 726 are the command/write data/address bus signals for the respective A and B ports. The busses ARD 711 and BRD 721 are the read data bussed for the respective A and B ports. A stall signal 719 is for port A is and a stall signal 729 is for port B. Command/write data/address FIFO memory buffer CWBUF 720 is in the CWDA 716 path. Read data FIFO memory buffer RDBUF 710 is in the RDA 717 path. In the preferred embodiment, port A 701 is connected to a data transfer bus node of data transfer controller 255 and port B 702 is connected to the corresponding processor 681 of that node. Cache/wrapper control unit 770 receives command/write data/address bus signal ACWD 705 from data transfer bus node port A 701 and command/write data/address bus signal BCWD 706 from central processing unit port B 702. Depending on these signals, cache/wrapper control unit 770 controls: read FIFO multiplexer A 712 to select either read data on read data bus RDA 717 or recalled from read data FIFO memory buffer 710; command/write data/address FIFO multiplexer 713 to select command, write data and address signals from cache/wrapper control unit 770 corresponding to ACWD 705 or command, write data and address signals stored in command/write data/address FIFO memory buffer CWBUF 720; and port multiplexer 748 via port multiplexer control signal 731 to select either command/write data/address signals 716 from command/write data/address FIFO multiplexer 713 or command/write data/address signals 726 from cache/wrapper control unit corresponding to command/write data/address signals BCWD 705 from central processing unit port B 702. The manner of control of these multiplexers is detailed below.

Command/write data/address bus CWD 736 supplies command, write data and address signals corresponding to the signals 632, 638 and 633, respectively, illustrated in FIG. 6. Read data bus RD 737 supplies read data to both the to data transfer bus node port A 701 via bus RDA 717 and to central processing unit port 702 via bus RDB 721 which are wired together. Central processing unit port B sees a SRAM with a write latency $L_w$ and a read latency $L_r$ of the underlying single port SRAM 750. However, the data transfer bus node of port A 701 attached, for example to a transfer controller with hub and ports architecture as shown in FIG. 4, sees a SRAM with larger read latency $L_r$ and a variable write latency $L_w$. The read latency $L_r$ is larger by an amount that depends on the depth of read FIFO memory buffer RDBUF 710 and command/write data/address FIFO memory buffer CWBUF 720. This additional read latency could be 1, 2 or more clock cycles.

An example helps to illustrate the basic principle. Assume that RDBUF 710 and CWBUF 720 are each only one entry deep. This means that the read latency $L_r$ seen by port A is one clock cycle greater than the read latency $L_r$ seen by port B.

Scenario #1

If an access is requested on port B, and no access is requested on port A and CWBUF 720 does not contain a read, the port B access is passed immediately to SRAM 750. If the access is a read, the data will be passed straight out on port B read bus BRD 721.

Scenario #2

If an access is requested on port A, and no access is requested on port B, then one of two things can happen:

(a) if CWBUF 720 is empty, the port A access is passed immediately to SRAM 750. If the access is a read, the data will be delayed through RDBUF 710 before being output on port A read bus ARD 711.

(b) if CWBUF 720 is not empty, the request in CWBUF 720 is passed to SRAM 750, and the current port A request is stored in CWBUF 720. If the request in CWBUF 720 is a read, the data will be passed directly to port A read bus ARD 711.

Scenario #3

If an access is requested on port A and B at the same time, then one of two things can happen:

(a) If CWBUF 720 is empty, then the port B access will be passed to SRAM 750, and the port A access will be stored in CWBUF 720.

(b) If CWBUF 720 is full, then the port B access is stalled, the access in CWBUF 720 is passed to SRAM 750, and the current port A request is stored in CWBUF 720.

In the request stored in CWBUF 720 is a read, the data will be passed directly to port A read bus ARD 711.

Scenario #4

If no access is requested on either port, but a prior request is stored in CWBUF 750, this access will be passed to SRAM 750. If the access is a read, the data will be passed directly to port A read bus ARD 711.

Note the following.

(1) The read latency $L_r$ for port A is always constant. Either the command is delayed in CWBUF 720 or the data is delayed in RDBUF 710. The sum of the two delays is constant.

(2) For port A writes because there is no data to return to the requester, the command and write data can stay in CWBUF 720 for many cycles, until either there is no request from port B or another request from port A displaces it.

(3) A stall on port B will only be generated when CWBUF 720 is full and there are requests on both ports. In this case, port B will stall, the write request in CWBUF 720 will be passed to SRAM 750 and the request from port A will go into CWBUF 720.

(4) For port A reads, because the read latency is fixed, the requests can only be held in CWBUF 720 for a limited number of cycles. In this example the number of cycles is 1. A stall will be generated on port B if a request is made the cycle after CWBUF 720 fills.

(5) Making RDBUF 710 and CWBUF 720 FIFO buffers deeper reduces the probability of stall further. If the FIFOs were 3 stages, there would have to be 4 consecutive port A accesses, and 3 consecutive port B accesses in order to produce a stall on the fourth port A access. This would also increase the read latency $L_r$.

(6) Because write data from port A can be delayed through CWBUF 720, logic must be employed to detect if port B tries to read from an address for which there is a pending write in CWBUF 720. When this is detected, several different strategies can be adopted:

(a) Stall port B, allowing the access in CWBUF 720 to complete. This is probably simplest, but could result in multiple stall cycles if CWBUF 720 is more than one stage deep and the pertinent access is not at the head of the FIFO.

(b) Multiplex the data from CWBUF 720 into the ARD 711 path. This is more expensive to implement, but the performance is higher.

(7) A further enhancement is that the write commands/data can be stored in a separate FIFO memory buffer from the read commands. The reason for this is that whereas read commands can stay in CWBUF 720 no longer the number of stages it contains in order to guarantee a fixed read latency, while write commands can be stored indefinitely. This is because data transfer bus node port A 701 is waiting for the read data and a prolonged read latency probably would stall the node. In contrast, data transfer bus node port A 701 is probably not waiting for a write to complete and thus a prolonged write latency would probably not stall the node. When there is a mixture of reads and writes, this should further reduce the stall probability, though obviously at added cost. Thus CWBUF 720 could be divided into separate read and write buffers. Alternatively, CWBUF 720 could use a unified storage area but separately control and sequence read and write accesses.

Figure 8:
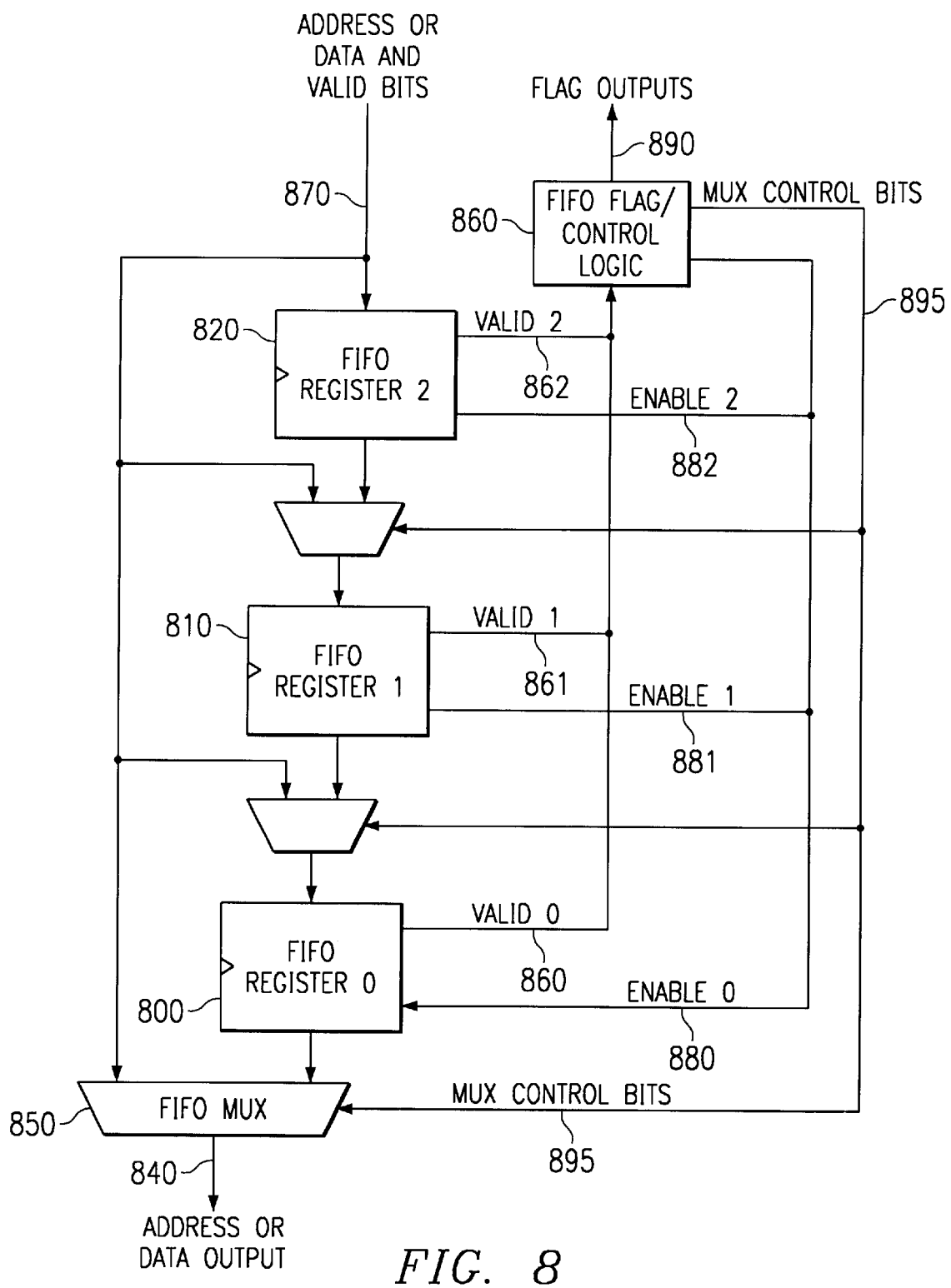
FIG. 8 illustrates a FIFO memory used in a low cost single port SRAM structure with dual port functionality.

FIG. 8 illustrates the configuration for a three stage FIFO used for RDBUF 710 and CWBUF 720 in FIG. 7. These FIFOs are synchronous, i.e. the read and write clocks are common, which simplifies the FIFO requirements. Valid bits are included in the registered data at each stage. The logic block 860 contains flag and multiplexer/clock control logic which generates the empty and full signals and derives the required clock disable and enable for both read and write operations.

The FIFO operation is as follows and is described in the context of CWBUF 720. Use of this structure for RDBUF 710 would be similar. Suppose the FIFO is empty. A write is requested. If the other port is not busy, the address or data input 870 at the top is passed through via the multiplexer 850 the bottom. If the other port is using SRAM 750, then the data is loaded into FIFO register 0 800, whose valid bit is then set. If on subsequent cycles, the other port is still busy, any incoming address/data will be loaded into FIFO register 1 810, and then into FIFO register 2 820. On the next cycle when the other port is not busy, if the valid bit for stage 0 is set, the address/data stored in this stage is passed to SRAM 750 via FIFO multiplexer 850. The contents of all the FIFO registers is shifted down one. The valid bits are adjusted accordingly.

The invention may be used to provide separate ports for a data transfer node and a central processing unit for separate program and data SRAMs associated with each central processing unit. Each of these SRAMs would be four banks wide. The anticipated access patterns are as follows. The data SRAM would be accessed by the central processing unit one or two banks per cycle. Most often accesses would sweep across the banks, but some algorithms would alternate among the banks less, and occasionally remain within only one SRAM bank. The program SRAM would accessed by the central processing unit all four banks at a time. However, the program SRAM would be accessed only every cycle ans then only during tight loops with very high instruction parallelism. Although stalling tight loops is not desirable, stalls would only be occasional, as there is likely to be only one cache fetch for next block of code during tight loop. Data transfer controller would access either program or data SRAM one bank at a time. Because of nature of direct memory access, accesses would always be to sequential banks. Thus the data transfer controller would only access each bank once per four cycles. Thus even with only 1-deep FIFOs, stalls on writes would only occur if the central processing unit accessed same bank for four consecutive cycles.

Figure 9:
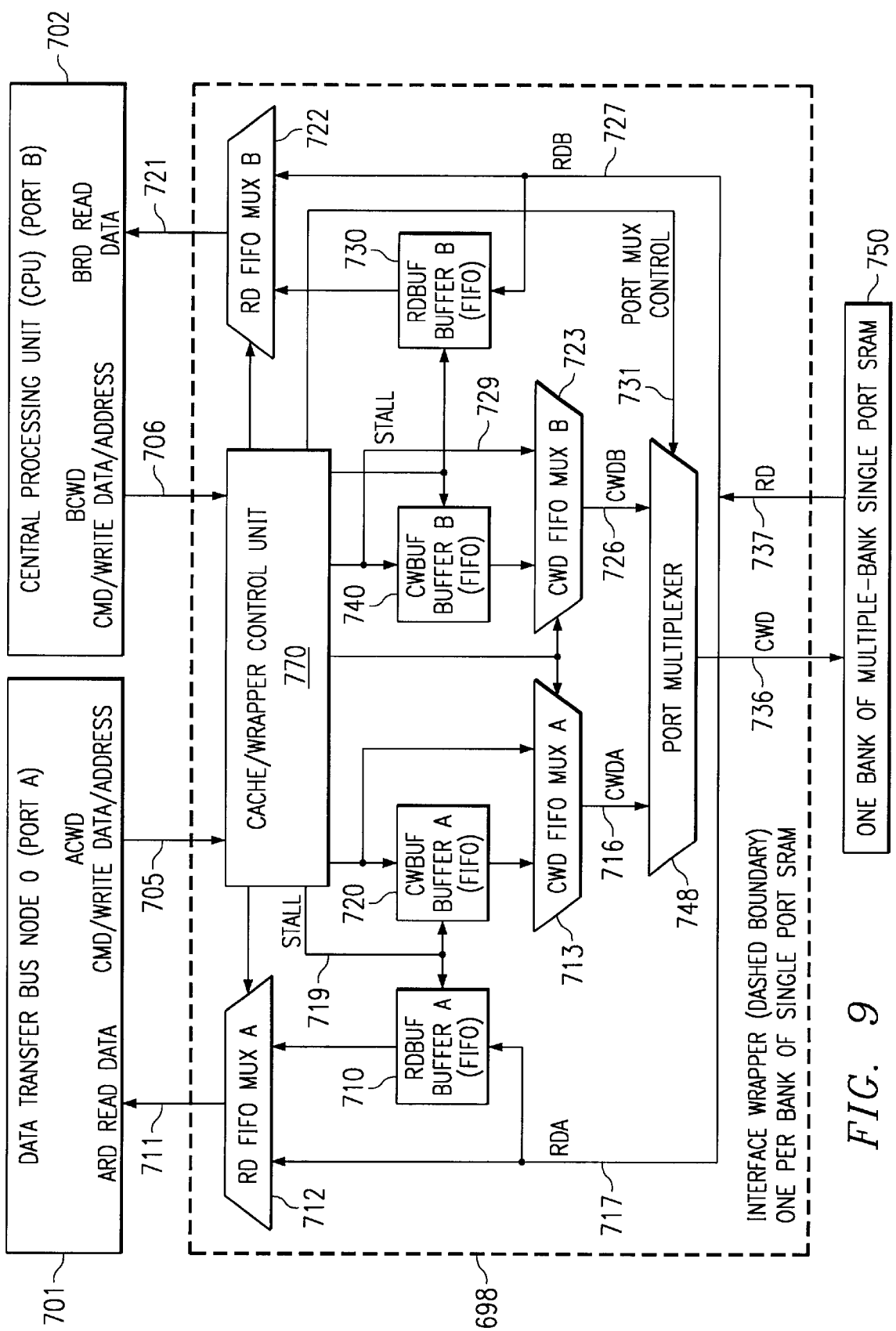
FIG. 9 illustrates a symmetrical low cost SRAM structure with dual port SRAM functionality.

There are other potential variations of this invention. These include stalling port A instead of port B on conflicting accesses when port A desires a read. Alternatively, the invention could have ability to stall either port based on some algorithm to balance performance. Finally, the invention could provide FIFO buffers line RDBUF 710 and CWBUF 720 to both ports. This is illustrated in FIG. 9. This might perform better for some applications.

FIG. 9 illustrates a symmetrical version of an alternate embodiment of the present invention. The four scenarios used in describing the asymmetrical version of FIG. 7 can be extended to the symmetrical version of FIG. 9. The cache/wrapper control unit 770 is more sophisticated in the symmetrical version and will include an arbiter unit operating on an algorithm which on any given cycle will stall one port or the other. Cache/wrapper control unit 770 controls read FIFO multiplexer 722 and command/write data/address FIFO multiplexer 723 in a manner similar to that described above. Read data buffer RDBUF 730 and command/write data/address buffer CWBUF 740 enable port B accesses to be stored to better balance the access latencies between the two ports. This would be most useful in cases where one port tended to hog the memory.

What is claimed is:

1. A method of implementing a dual port function employing a single port memory having a command, write data and address input and a read data output comprising the steps of:

receiving memory access requests on a first port and a second port;

servicing a received memory access from either requesting port via the single port memory by connecting said requesting port to the single port memory if only one port requests memory access;

buffering a memory access request received from said first port in a request first-in-first-out memory if said request first-in-first-out memory is not full and memory access requests are received from both said first port and said second port;

stalling a memory access request received from said second port and connecting a first entered memory access request buffered in said request first-in-first-out memory to the single port memory if said request first-in-first-out memory is full and a memory access request is received from said second port; and connecting a first entered memory access request buffered in said request first-in-first-out memory to the single port memory if said request first-in-first-out memory is not empty and no memory access request is received from said second port.

2. The method of claim 1, further comprising the step of:

buffering read data from the read data output of the single port memory recalled in response to a read memory access request received from said first port in a read data first-in-first-out memory before supply to said first port to achieve a fixed latency equal to the depth of said request first-in-first-out memory from receipt of a read memory access request from said first port until supply of read data to said first port.

3. The method of claim 1, further comprising the step of:

buffering a memory access request received from said first port in said request first-in-first-out memory and connecting a first entered memory access request buffered in said request first-in-first-out memory to the single port memory if said request first-in-first-out memory is not empty.

4. The method of claim 1, wherein the single port memory is constructed of plural memory banks and further comprising the steps of:

determining from an address of a memory access request received from said first port and said second port a one of the plural memory banks addressed; and wherein said steps of servicing a received memory access, buffering a memory access request received from said first port, stalling a memory access request received from said second port and connecting a first entered memory access request buffered in said request first-in-first-out memory to the single port memory are performed for each of said plural memory banks with respect to memory access request directed to the corresponding memory bank.

5. The method of claim 1, further comprising the step of:

detecting whether a read memory access request received from said second port specifies a read address equal to a write address of a write memory access request buffered in said request first-in-first-out memory; and upon detecting a read memory access request received from said second port specifies a read address equal to a write address of a write memory access request buffered in said request first-in-first-out memory stalling said second port and connecting a first entered memory access request buffered in said request first-in-first-out memory to the single port memory until said write memory access request is connected to the single port memory.

6. The method of claim 1, further comprising the step of:

detecting whether a read memory access request received from said second port specifies a read address equal to a write address of a write memory access request buffered in said request first-in-first-out memory; and upon detecting a read memory access request received from said second port specifies a read address equal to a write address of a write memory access request buffered in said request first-in-first-out memory supplying read data to said second port equal to said write data of said write memory access request buffered in said request memory first-in-first-out memory.

7. The method of claim 1, wherein the single port memory is constructed of plural memory banks and further comprising the steps of:

determining from an address of any memory access request received from said first port and from said second port a one of the plural memory banks addressed; and wherein said steps of servicing a received memory access, buffering a read memory access request received from said first port in said read request first-in-first-out memory, stalling a memory access request received from said second port and connecting a first entered memory access request buffered in said read request first-in-first-out memory to the single port memory, connecting a first entered read memory access request buffered in said read request first-in-first-out memory to the single port memory, buffering a write memory access request received from said first port in a write request first-in-first-out memory, connecting a first entered write memory access request buffered in said write request first-in-first-out memory to the single port memory and buffering read data from the read data output of the single port memory are performed for each of said plural memory banks with respect to memory access request directed to the corresponding memory bank.

8. A method of implementing a dual port function employing a single port memory having a command, write data and address input and a read data output comprising the steps of:

receiving memory access requests on a first port and a second port;

servicing a received memory access from either requesting port via the single port memory by connecting said requesting port to the single port memory if only one port requests memory access;

buffering a read memory access request received from said first port in a read request first-in-first-out memory if said read request first-in-first-out memory is not full and a read memory access request is received said first port and a memory access request is receive from said second port;

stalling a memory access request received from said second port and connecting a first entered memory access request buffered in said read request first-in-first-out memory to the single port memory if said read request first-in-first-out memory is full and a memory access request is received from said second port;

connecting a first entered read memory access request buffered in said read request first-in-first-out memory to the single port memory if said read request first-in-first-out memory is not empty and a memory access request is not received from said second port;

buffering a write memory access request received from said first port in a write request first-in-first-out memory if said write request first-in-first-out memory is not full and a memory access request is received from said second port;

connecting a first entered write memory access request buffered in said write request first-in-first-out memory to the single port memory if said write request first-in-first-out memory is not empty and no memory access request is received from said second port; and buffering read data from the read data output of the single port memory recalled in response to a memory access request received from said first port in a read data first-in-first-out memory before supply to said first port to achieve a fixed latency equal to the depth of said read request first-in-first-out memory from receipt of a read memory access request from said first port until supply of read data to said first port.

9. The method of claim 8, further comprising the step of:

buffering a read memory access request received from said first port in said read request first-in-first-out memory and connecting a first entered read memory access request buffered in said read request first-in-first-out memory to the single port memory if said read request first-in-first-out memory is not empty.

10. The method of claim 8, further comprising the step of:

buffering a write memory access request received from said first port in said write request first-in-first-out memory and connecting a first entered write memory access request buffered in said write request first-in-first-out memory to the single port memory if said write request first-in-first-out memory is not empty and no memory access request is received from said second port.

11. The method of claim 8, further comprising the step of:

detecting whether a read memory access request received from said second port specifies a read address equal to a write address of a write memory access request buffered in said write request first-in-first-out memory; and upon detecting a read memory access request received from said second port specifies a read address equal to a write address of a write memory access request buffered in said write request first-in-first-out memory stalling said second port and connecting a first entered memory access request buffered in said write request first-in-first-out memory to the single port memory until said write memory access request is connected to the single port memory.

12. The method of claim 8, further comprising the step of:

detecting whether a read memory access request received from said second port specifies a read address equal to a write address of a write memory access request buffered in said write request first-in-first-out memory; and upon detecting a read memory access request received from said second port specifies a read address equal to a write address of a write memory access request buffered in said write request first-in-first-out memory supplying read data to said second port equal to said write data of said write memory access request buffered in said write request memory first-in-first-out memory.

13. A memory controller comprising:

a single port memory having a command/write data/address input and a read data output;

a first port receiving first command, first write data and first address from a first memory requestor node and supplying read data from said read output of said single port memory to said first memory requester;

a second port receiving second command, second write data and second address from a second memory requester node and supplying read data from said read output of said single port memory to said second memory requester;

a command/write data/address first-in-first-out buffer having an input receiving said first command, said first write data and said first address from said first port, and having an output;

a command/write data/address multiplexer having a first input connected to said output of said command/write data/address first-in-first-out buffer, a second input receiving said first command, said first write data and said first address from said first port and an output;

a port multiplexer having first input connected to said output of said command/write data/address multiplexer, a second input receiving said second command, said second write data and said second address from said second port and an output connected to said command/write data/address input of said single port memory; and a memory controller connected to said command/write data/address multiplexer and said port multiplexer, said memory controller controlling said command/write data/address multiplexer and said port multiplexer to select said second input of said port multiplexer to connect a memory access request received from said second port to said single port memory if a memory access request is received from said second port, a memory access request is not received from said first port and said command/write data/address first-in-first-out buffer is empty, select said second input to said command/write data/address multiplexer and said first input of said port multiplexer to connect a memory access request received from said first port to said single port memory if a memory access request is received from said first port, a memory access request is not received from said second port and said command/write data/address first-in-first-out buffer is empty, select said first input to said command/write data/address multiplexer and said first input of said port multiplexer to connect a memory access request stored in said command/write data/address to said single port memory if a memory access request is not received from said second port and said command/write data/address first-in-first-out buffer is not empty, and select said first input to said command/write data/address multiplexer and said first input of said port multiplexer to connect a memory access request stored in said command/write data/address to said single port memory and sending a stall signal to said second port if a memory access request is received from said first port, a memory access request is received from said second port and said command/write data/address first-in-first-out buffer is full.

14. The memory controller of claim 13, further comprising:
a read data first-in-first-out buffer having an input connected to said read data output of said single port memory and an output;
a read data multiplexer having a first input connected to said read data output of said single port memory, a second input connected to said output of said read data first-in-first-out buffer and an output supplying read data to said first port; and
wherein said memory controller is further connected to said read data multiplexer to control said read data multiplexer to achieve a fixed latency equal to the depth of said command/write data/address first-in-first-out buffer of a read memory access request from said first port until supply of read data to said first port.

* * * * *